United States Patent
Vasquez et al.

(10) Patent No.: US 10,374,153 B2
(45) Date of Patent: Aug. 6, 2019

(54) METHOD FOR MANUFACTURING A MAGNETIC MEMORY DEVICE BY PRE-PATTERNING A BOTTOM ELECTRODE PRIOR TO PATTERNING A MAGNETIC MATERIAL

(71) Applicant: Spin Memory, Inc., Fremont, CA (US)

(72) Inventors: Jorge Vasquez, San Jose, CA (US); Bartlomiej Adam Kardasz, Pleasanton, CA (US); Mustafa Pinarbasi, Morgan Hill, CA (US); Girish Jagtiani, Santa Clara, CA (US)

(73) Assignee: SPIN MEMORY, INC., Fremont, CA (US)

( * ) Notice: Subject to any disclaimer, the term of this patent is extended or adjusted under 35 U.S.C. 154(b) by 0 days.

(21) Appl. No.: 15/859,171

(22) Filed: Dec. 29, 2017

(65) Prior Publication Data

US 2019/0207104 A1    Jul. 4, 2019

(51) Int. Cl.
*G11C 11/16* (2006.01)
*H01L 43/02* (2006.01)
(Continued)

(52) U.S. Cl.
CPC ............ *H01L 43/12* (2013.01); *G11C 11/161* (2013.01); *H01L 21/7684* (2013.01);
(Continued)

(58) Field of Classification Search
CPC ....... H01L 27/222; H01L 43/02; H01L 43/08; H01L 43/10; H01L 43/12;
(Continued)

(56) References Cited

U.S. PATENT DOCUMENTS 5,089,442 A * 2/1992 Olmer ................ C23C 16/0272
                                                          204/192.12
9,780,301 B1 * 10/2017 Chuang .................. H01L 43/12
(Continued)

OTHER PUBLICATIONS

NPL: About the Ion Milling Process, Wayback Machine: http://web.archive.org/web/20171120100904/http://www.ionbeammilling.com/about_the_ion_milling_process; captured on Nov. 20, 2017.*

*Primary Examiner* — Marc Anthony Armand
*Assistant Examiner* — Younes Boulghassoul
(74) *Attorney, Agent, or Firm* — Zilka-Kotab, P.C.

(57) ABSTRACT

A method for manufacturing a magnetic random access memory element that allows for improved magnetic element pillar formation in a high density magnetic memory element array. The method allows a magnetic memory element pillar to be formed by ion milling with a lower pillar height for reduced shadowing effect. A memory element seed layer and under-layer are first formed on a substrate and layer of electrically insulating material such as silicon oxide is deposited. A chemical mechanical polishing process is performed, leaving the seed layer and under-layer surrounded by a layer of electrically insulating material having an upper surface that is coplanar with an upper surface of the under-layer. A magnetic memory element pillar is formed over the seed layer and under-layer by depositing the magnetic memory element material, forming a mask over the magnetic memory element material and performing an ion milling process to form a magnetic memory element pillar.

13 Claims, 13 Drawing Sheets

(51) Int. Cl.
  *H01L 43/08* (2006.01)
  *H01L 43/10* (2006.01)
  *H01L 43/12* (2006.01)
  *H01L 21/768* (2006.01)
  *H01L 27/22* (2006.01)
(52) U.S. Cl.
  CPC ............ *H01L 27/222* (2013.01); *H01L 43/02* (2013.01); *H01L 43/08* (2013.01); *H01L 43/10* (2013.01)
(58) Field of Classification Search
  CPC ......... H01L 21/027–0338; H01L 21/32; H01L 21/0271–0273; H01L 21/312–3128; H01L 21/033–0338; H01L 21/314–3185; H01L 21/7681; H01L 21/76811; H01L 21/308–3088; H01L 21/31144; H01L 21/32139; H01L 21/467; H01L 21/475; H01L 21/469–47576; H01L 21/0273–0279; G11C 11/161
  See application file for complete search history.

(56) References Cited

U.S. PATENT DOCUMENTS

| | | | |
|---|---|---|---|
| 9,959,500 B1* | 5/2018 | Torng | G06N 3/08 |
| 9,972,777 B1* | 5/2018 | Haq | H01L 43/12 |
| 2007/0297103 A1* | 12/2007 | Zhang | B82Y 10/00 |
| | | | 360/324.12 |
| 2011/0198314 A1* | 8/2011 | Wang | B82Y 25/00 |
| | | | 216/22 |
| 2013/0154037 A1* | 6/2013 | Guha | H01L 43/12 |
| | | | 257/421 |
| 2016/0027999 A1* | 1/2016 | Pinarbasi | H01L 43/02 |
| | | | 438/3 |
| 2017/0194558 A1* | 7/2017 | Lee | G06F 3/0611 |
| 2017/0200487 A1* | 7/2017 | Kim | G11C 11/161 |
| 2017/0256708 A1* | 9/2017 | Krounbi | H01L 43/12 |
| 2018/0350873 A1* | 12/2018 | Nikitin | H01L 27/222 |

* cited by examiner

METHOD FOR MANUFACTURING A MAGNETIC MEMORY DEVICE BY PRE-PATTERNING A BOTTOM ELECTRODE PRIOR TO PATTERNING A MAGNETIC MATERIAL

FIELD OF THE INVENTION

The present invention relates to magnetic random access memory (MRAM), and more particularly to a method for manufacturing a magnetic random access memory element pillar with improved pillar definition and optimal under-layer thickness.

BACKGROUND

Magnetic Random Access Memory (MRAM) is a non-volatile data memory technology that stores data in magnetoresistive cells, such as Magnetoresistive Tunnel Junction (MTJ) elements. At their most basic level, such MTJ elements include first and second magnetic layers that are separated by a thin, non-magnetic tunnel barrier layer, which may be constructed of an insulating barrier material, such as MgO, $Al_2O_3$, etc. The first magnetic layer, which may be referred to as a reference layer, has a magnetization that is fixed in a direction that is perpendicular to that of a plane of the layer. The second magnetic layer has a magnetization that is free to move so that it may be oriented in either of two directions that are both generally perpendicular to the plane of the free magnetic layer. Therefore, the magnetization of the free layer may be either parallel with the magnetization of the reference layer or anti-parallel with the direction of the reference layer (i.e., opposite to the direction of the reference layer).

The electrical resistance through the MTJ element in a direction perpendicular to the planes of the layers changes with the relative orientations of the magnetizations of the magnetic reference layer and magnetic free layer. When the magnetization of the magnetic free layer is oriented in the same direction as the magnetization of the magnetic reference layer, the electrical resistance through the MTJ element is at its lowest electrical resistance state. Conversely, when the magnetization of the magnetic free layer is in a direction that is opposite to that of the magnetic reference layer, the electrical resistance across the MTJ element is at its highest electrical resistance state.

The switching of the MTJ element between high and low resistance states results from electron spin transfer. Each electron has a spin orientation. Generally, electrons flowing through a conductive material have random spin orientations with no net spin orientation. However, when electrons flow through a magnetized layer, the spin orientations of the electrons become aligned so that there is a net aligned orientation of electrons flowing through the magnetic layer, and the orientation of this alignment is dependent on the orientation of the magnetization of the magnetic layer through which they travel. When the orientations of the magnetizations of the free layer and the reference layer are oriented in the same direction, the spin of the electrons in the free layer are generally in the same direction as the orientation of the spin of the electrons in the reference layer. Because these electron spins are generally in the same direction, the electrons may pass relatively easily through the tunnel barrier layer. However, if the orientations of the magnetizations of the free layer and the reference layer are opposite to one another, the spin of electrons in the free layer will generally be opposite to the spin of electrons in the reference layer. In this case, electrons do not easily pass through the barrier layer, resulting in a higher electrical resistance through the MTJ stack.

Because the MTJ element may be switched between low and high electrical resistance states, it may be used as a memory element to store data. For example, the low resistance state may be read as a "1" or one, whereas the high resistance state may be read as a "0" or zero. In addition, because the magnetic orientation of the magnetic free layer remains in its switched state without any electrical power being provided to the element, the memory storage provided by the MTJ element is robust and non-volatile.

To write a bit of data to the MTJ cell, the magnetic orientation of the magnetic free layer is switched from a first direction to a second direction that is 180° from the first direction. This may be accomplished, for example, by applying a current through the MTJ element in a direction that is perpendicular to the planes of the layers of the MTJ element. An electrical current applied in one direction will switch the magnetization of the free layer to a first orientation, whereas an electrical current applied in a second direction will switch the magnetic of the free layer to a second, opposite orientation.

Once the magnetization of the free layer has been switched by the current, the state of the MTJ element may be read by detecting a voltage across the MTJ element, thereby determining whether the MTJ element is in a "1" or "0" bit state. Advantageously, once the switching electrical current has been removed, the magnetic state of the free layer will remain in the switched orientation until some other time when an electrical current is applied to switch the MTJ element to the opposite state. Therefore, the recorded data bit is non-volatile in that it remains intact (the magnetic orientation of the free layer does not change) in the absence of any electrical current being supplied.

SUMMARY

The present invention provides a method for manufacturing a magnetic random access memory device. A seed layer is deposited, and an under-layer is deposited over the seed layer. A mask structure is formed over the under-layer, the mask being configured to cover a magnetic device area. An etching process is performed to remove portions of the under-layer and seed layer that are not protected by the mask, and an electrically insulating layer is deposited. A chemical mechanical polishing is performed sufficiently to expose the under-layer, and a magnetic memory element is formed over the under-layer.

The memory element pillar can be formed by depositing a magnetic memory element material, forming a magnetic memory element defining mask over the memory element material and performing an ion milling. The ion milling can be performed at one or more angles relative to normal. To form well defined side walls on the resulting magnetic memory element pillar.

Because the seed layer and under-layer were previously formed and do not contribute to the magnetic element pillar height during the ion milling process, the thickness of the seed layer and under-layer do not contribute to shadowing effects during the ion milling process. This advantageously allows the ion milling process to more effectively form well defined pillar structures even at very high density. This also advantageously allows the seed layer and under-layer to be formed with optimal thicknesses without constraint due to such shadowing effects.

The process results in a magnetic memory element structure that includes a seed layer and an under-layer having an upper surface formed over the seed layer. A first layer of electrically insulating material laterally surrounds the seed layer and under-layer, having an upper surface that is coplanar with the upper surface of the under-layer. A memory element pillar is formed over the under-layer, and a second layer of electrically insulating material laterally surrounds the memory element pillar, the second layer of electrically insulating material being formed on the first layer of electrically insulating material.

These and other features and advantages of the invention will be apparent to one of skill in the art upon reading of the following detailed description of the embodiments in conjunction with the figures. In the figures, like reference numerals used in more than one figure indicate a like element, and may be considered in light of the description of the like element presented in any of the other figures having the like element.

BRIEF DESCRIPTION OF THE DRAWINGS

For a fuller understanding of the nature and advantages of this invention, as well as the preferred mode of use, reference should be made to the following detailed description read in conjunction with the accompanying drawings. The drawings are not presented to scale unless specified otherwise on an individual basis.

DETAILED DESCRIPTION

The following description includes the best embodiments presently contemplated for carrying out the invention. This description is made for the purpose of illustrating the general principles of this invention and is not meant to limit the inventive concepts claimed herein in any way.

Figure 1:
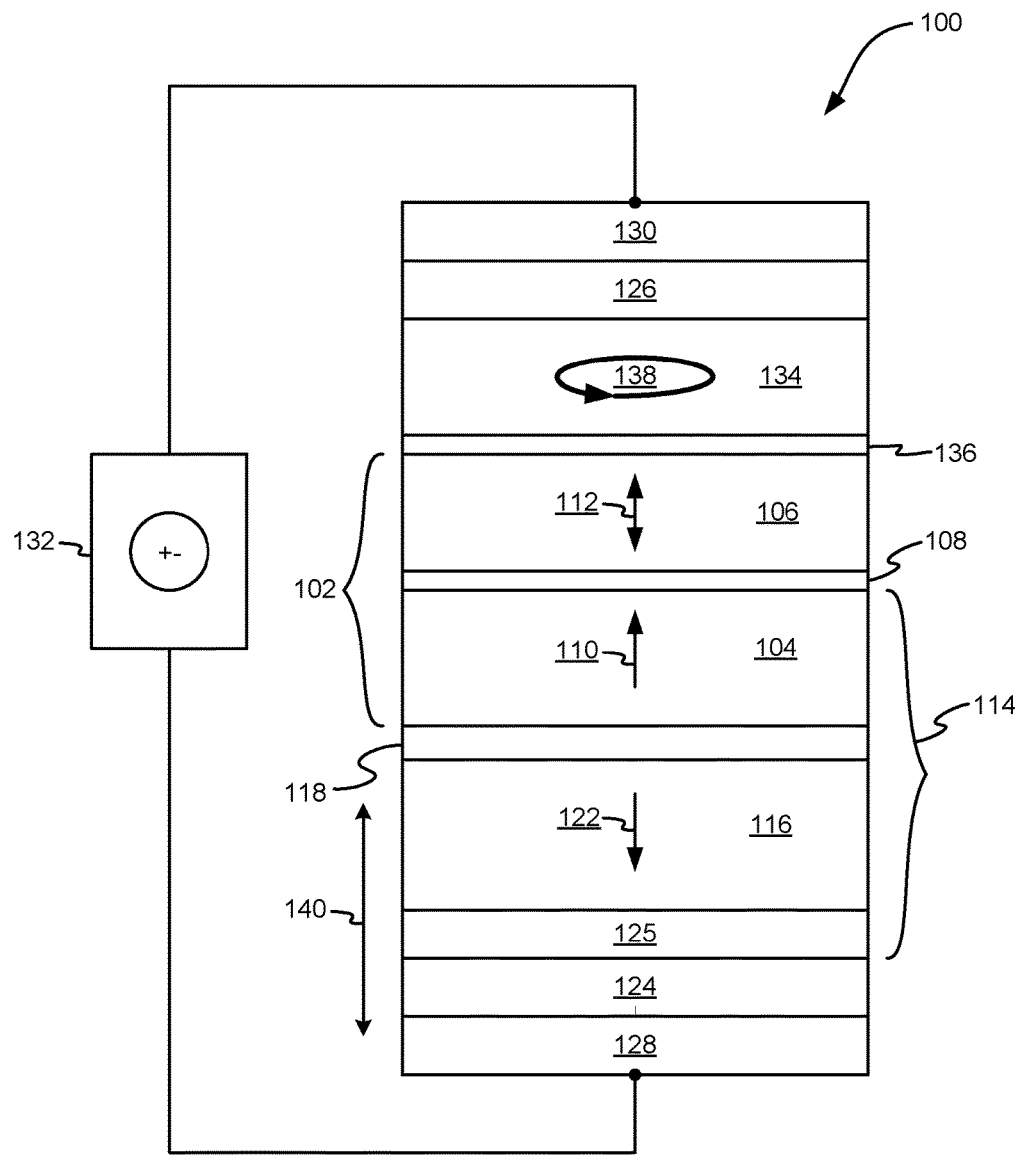
FIG. 1 is a schematic, cross-sectional view of a portion of a magnetic memory element, which may be used in embodiments of the invention.

Referring to FIG. 1, a magnetic memory element 100 is shown according to one embodiment. The memory element 100 may be used in a perpendicular magnetic tunnel junction (pMTJ) memory element, as described in various embodiments herein. The memory element 100 may include a magnetic tunnel junction (MTJ) 102 that may include a magnetic reference layer 104, a magnetic free layer 106, and a thin, non-magnetic, electrically-insulating magnetic barrier layer 108 positioned between the reference layer 104 and the free layer 106 in an element height direction 140. The barrier layer 108 may include an oxide, such as MgO, $Al_2O_3$, etc., or some other suitable material known in the art. The reference layer 104 has a magnetization 110 that is fixed in a direction that is perpendicular to a horizontal plane of the layer, as indicated by the arrow. The horizontal plane is sometimes referred to as a plane of formation in the embodiments described herein. The free layer 106 has a magnetization 112 that may be in either of two directions perpendicular to a horizontal plane of the free layer 106, as indicated by the two arrows. While the magnetization 112 of the free layer 106 remains in either of two directions perpendicular to the plane of the free layer 106 in a quiescent state, it may be selectable switched between these two directions, as is described in greater detail herein. When the magnetization 112 of the free layer 106 is in the same direction as the magnetization 110 of the reference layer 104, the electrical resistance across the MTJ 102 is at a low resistance state. Conversely, when the magnetization 112 of the free layer 106 is opposite to the magnetization 110 of the reference layer 104, the electrical resistance across the MTJ 102 is in a high resistance state.

The reference layer 104 may be part of an anti-parallel magnetic pinning structure 114 that may include a magnetic keeper layer 116 and a non-magnetic, antiparallel coupling layer 118 positioned between the keeper layer 116 and the reference layer 104 in the element height direction 140. The antiparallel coupling layer 118 may comprise any suitable material known in the art, such as Ru, and may be constructed to have a thickness that causes ferromagnetic antiparallel coupling of the keeper layer 116 and the reference layer 104. The antiparallel coupling between the keeper layer 116 and the reference layer 104 pins the magnetization 110 of the reference layer 104 in a second direction opposite to the direction of magnetization 122 of the keeper layer 116.

In another approach, a capping layer 126 may be positioned above the free layer 106 to protect the underlying layers during manufacture, such as during high temperature annealing.

A lower electrode 128 and an upper electrode 130 may be positioned near a bottom and a top of the memory element 100, respectively, in one approach. The lower electrode 128 and the upper electrode 130 may be constructed of a non-magnetic, electrically conductive material of a type known in the art, such as Au, Ag, Cu, etc., and may provide an electrical connection with a circuit 132. The circuit 132 may include a current source, and may further include circuitry for reading an electrical resistance across the memory element 100.

The magnetic free layer 106 has a magnetic anisotropy that causes the magnetization 112 of the free layer 106 to remain stable in one of two directions perpendicular to the horizontal plane of the free layer 106. In a write mode of use for the memory element 100, the orientation of the magnetization 112 of the free layer 106 may be switched between these two directions by applying an electrical current through the memory element 100 via the circuit 132. A current in a first direction causes the magnetization 112 of the free layer 106 of the memory element 100 to flip to a first orientation, and a current in a second direction opposite to the first direction causes the magnetization 112 of the free layer 106 of the memory element 100 to flip to a second, opposite direction.

For example, if the magnetization 112 is initially oriented in a downward direction in FIG. 1, applying a current in a downward direction through the memory element 100 causes electrons to flow in an opposite direction upward through the memory element 100. Electrons travelling through the reference layer 104 become spin polarized as a result of the magnetization 110 of the reference layer 104. These spin-polarized electrons cause a spin torque on the magnetization 112 of the free layer 106, which causes the magnetization 112 to flip directions, from the downward direction to an upward direction.

On the other hand, if the magnetization 112 of the free layer 106 is initially in an upward direction in FIG. 1, applying an electrical current through the memory element 100 in an upward direction in FIG. 1 causes electrons to flow in an opposite direction, downward through the memory element 100. Because the magnetization 112 of the free layer 106 is in the same direction as the magnetization 110 of the reference layer 104, the electrons with opposite spin will not be able to pass through the barrier layer 108 into the reference layer 104. As a result, the electrons with the opposite spin will accumulate at the junction between the free layer 106 and the barrier layer 108. This accumulation of spin polarized electrons causes a spin torque that causes the magnetization 112 of the free layer 106 to flip from the upward direction to a downward direction.

In order to assist the switching of the magnetization 112 of the free layer 106, the memory element 100 may include a spin polarization structure 134 positioned above the free layer 106. The spin polarization layer 134 may be separated from the free layer 106 by an exchange coupling layer 136. The spin polarization structure 134 has a magnetic anisotropy that causes it to have a magnetization 138 with a primary component oriented in the in plane direction (e.g., perpendicular to the magnetization 112 of the free layer and the magnetization 110 of the reference layer 104). The magnetization 138 of the spin polarization layer 134 may either be static or may move in a precessional manner as shown in FIG. 1. The magnetization 138 of the spin polarization layer 134 causes a spin torque on the free layer 106 that assists in moving its magnetization 112 away from its quiescent state perpendicular to the plane of the free layer 106. This allows the magnetization 112 of the free layer 106 to more easily flip with less energy being utilized to flip the magnetization 112 in response to applying a write current to the memory element 100.

The memory element 100 described in FIG. 1 is intended to provide context to the various embodiments described herein. The structures and methods described herein in accordance with various embodiments may comprise a portion of the memory element 100 described in FIG. 1 and/or used in conjunction with the memory element 100, in various approaches.

An under-layer 125 is located beneath the keeper layer 116. The under-layer can be constructed of a material such as ruthenium (Ru) or rhodium (Rh) and functions to set the crystal structure of the follow on pMTJ layers. A seed layer 124 is positioned below the under-layer 125 in the element height direction 140 to initiate a desired crystalline structure in the layers deposited there-above. The seed layer 124 and under-layer 125 constitute a significant portion of the thickness (in the vertical direction in FIG. 1) of the memory element 100. The thickness of the memory element 100 has a direct impact on the density of memory array fabrication when forming a magnetic tunnel junction memory element pillar 100. As will be described in further detail herein below, such memory element pillars can be defined by ion milling. However, at high data densities where the memory elements are spaced close together, shadowing affects from adjacent memory element pillars have significant impact on the quality of the memory element that can be defined by ion milling. This shadowing from the thick pMTJ layers prevents the use of optimal ion milling angles during the fabrication of memory element pillars. One way to reduce this shadowing effect would be to reduce the thickness of the layers making up the memory element pillar 100. However, this also results in a compromise in the quality of the memory element, because it requires using less than optimal layer thicknesses.

For example, as mentioned above, the seed layer 124 and under-layer when formed constitute a large portion (e.g. 20%) of the thickness of the memory element pillar. Reducing the thickness of these layers would reduce the overall memory element thickness only slightly and would also result in less than optimal thicknesses of the seed layer 124 and under-layer 125, resulting in diminished performance of these layers and corresponding diminished performance of the magnetic memory element 100. For example, if the seed layer 124 and under-layer 125 are not constructed sufficiently thick, the thermal and magnetic stability of the reference layer 104 can suffer, leading to decreased reliability and robustness to thermal stress.

The present invention overcomes this challenge by a novel process that is described in detail herein below, wherein the thickness of the seed layer 124, and under-layer 125 can be formed at their desired optimal thicknesses while having no detrimental effect on the pillar definition process.

Figure 2:
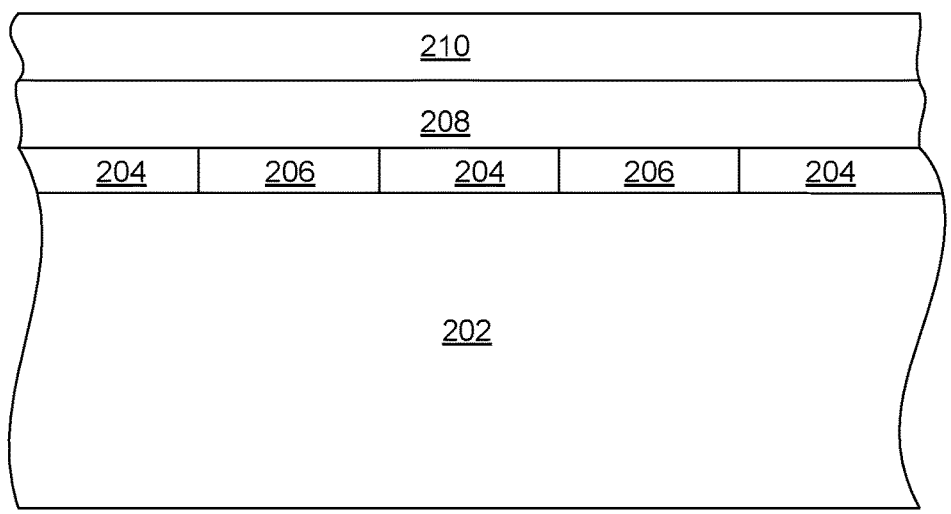
FIGS. 2-12 are cross-sectional views of a wafer in various intermediate stages of manufacture, illustrating a method for manufacturing a magnetic random access memory element according to an embodiment of the invention.

FIGS. 2-12 are cross-sectional views of a portion of a wafer in various intermediate stages of manufacture, illustrating a method of manufacturing a magnetic memory element pillar according to an embodiment. With particular reference to FIG. 2, a substrate 202 is formed that includes electrically conductive contacts (electrodes) 206 that are separated from one another by dielectric, electrically insulating layers 204. The substrate 202 can also have circuitry such as CMOS circuitry (not shown) embedded therein. A seed layer 208 is deposited full film over the substrate 202 so as to cover the electrodes 206 and insulation layers 204. The seed layer can be a material such as tantalum (Ta) and is preferably deposited to a thickness of 5-100 angstroms. An under-layer 210 is then deposited over the seed layer 208. The seed layer 208 and under-layer 210 can both be deposited by sputter deposition.

Figure 3:
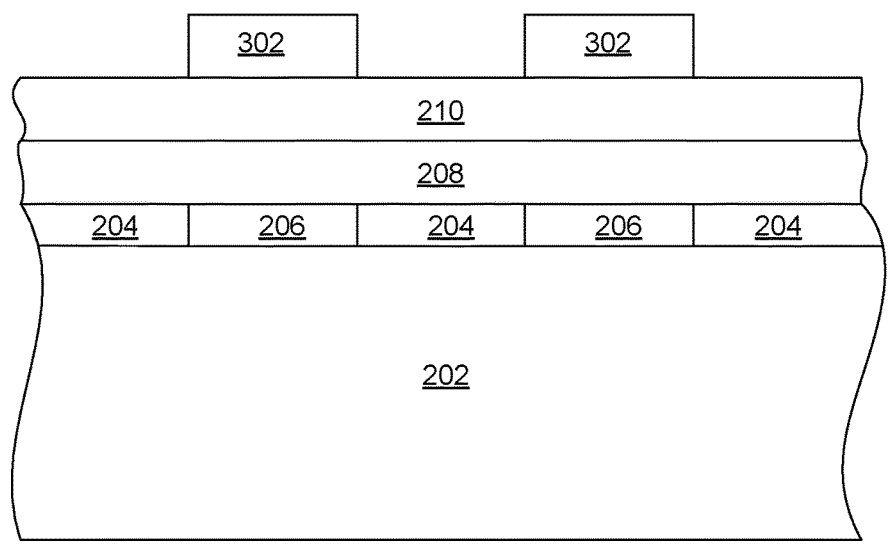

With reference to FIG. 3 a mask structure 302 is formed over the under-layer 210 and seed layer 208. The mask structure can be a photoresist mask, which can be photolithographically patterned to cover areas over the electrodes 206, while leaving adjacent areas over the insulation layer 204 uncovered, as shown in FIG. 3.

Figure 4:
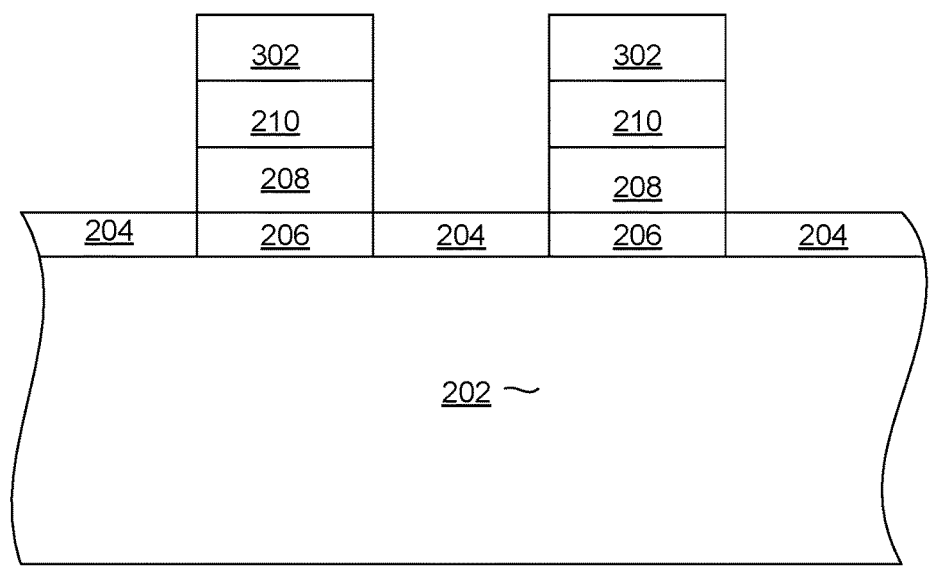

An etching process such as reactive ion etching is then performed to remove portions of the seed layer 208 and under-layer 210 that are not protected by the mask 302, leaving a structure such as that shown in FIG. 4. The etching process stops at the insulation layers 204. Then, the mask 302 can be removed by a process such as a chemical liftoff process.

Figure 5:
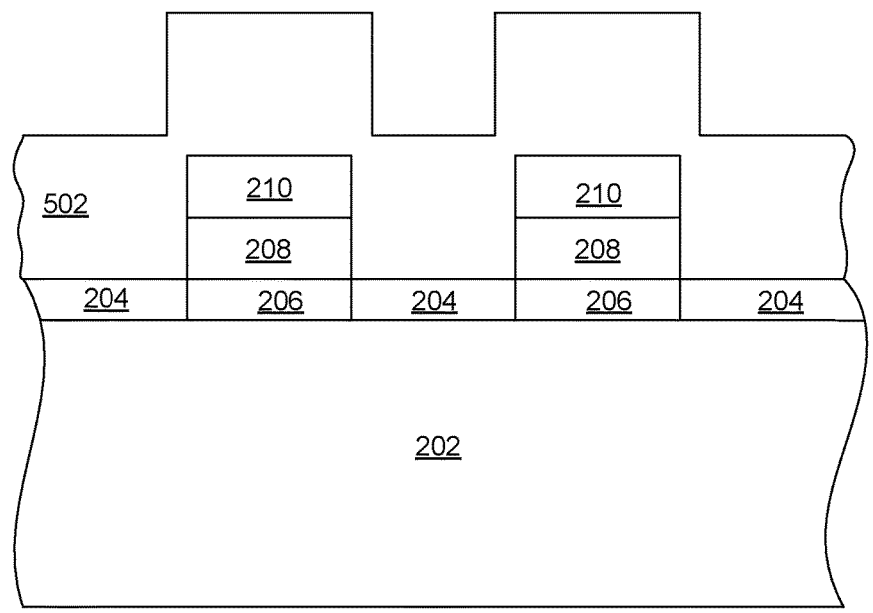

With reference now to FIG. 5, a layer of electrically insulating material 502 is deposited. The electrically insulating material 502 is preferably an oxide such as silicon oxide and more preferably comprises $SiO_2$. The electrically insulating material 502 can be deposited by sputter deposition, and is deposited to a thickness that is at least to the level of the top of the under-layer 210. After depositing the insulation layer 502, a Chemical Mechanical Polishing (CMP) process is performed to planarize the surface, thereby forming a surface of the electrically insulating material 502 that is co-planar with the upper surface of the under-layer 210. The CMP process is terminated when the under-layer 210 has been reached and exposed. After the CMP process has exposed the surface of the under-layer 210, an optional light deposition of under-layer material can be performed to provide an optimal under-layer surface for deposition of other layers thereon. This quick deposition can be a sputter deposition of only a few Angstroms (e.g. not greater than 3 Angstroms) of the same material that makes up the underlying layer 210, such as ruthenium.

Figure 6:
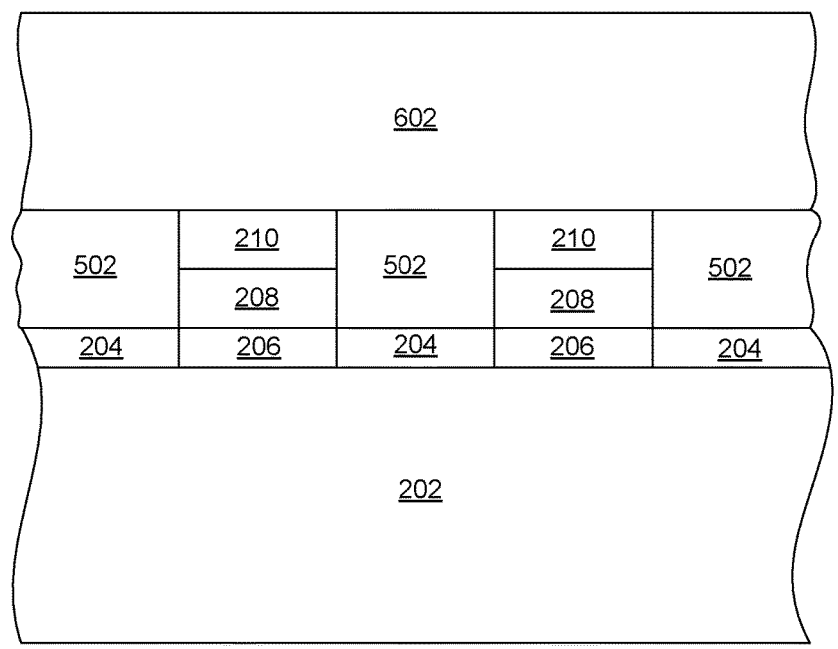

With reference to FIG. 6, a layer of material 602 making up the remainder of the magnetic memory element is deposited over the under-layer 210 and insulation layer 502. Although shown as a single layer in FIG. 6, it will be understood that the layer 602 includes various layers making up a magnetic tunnel junction memory element, such as a magnetic reference layer, a non-magnetic barrier layer, a magnetic free layer, a capping layer, as well as various other possible layers.

Figure 7:
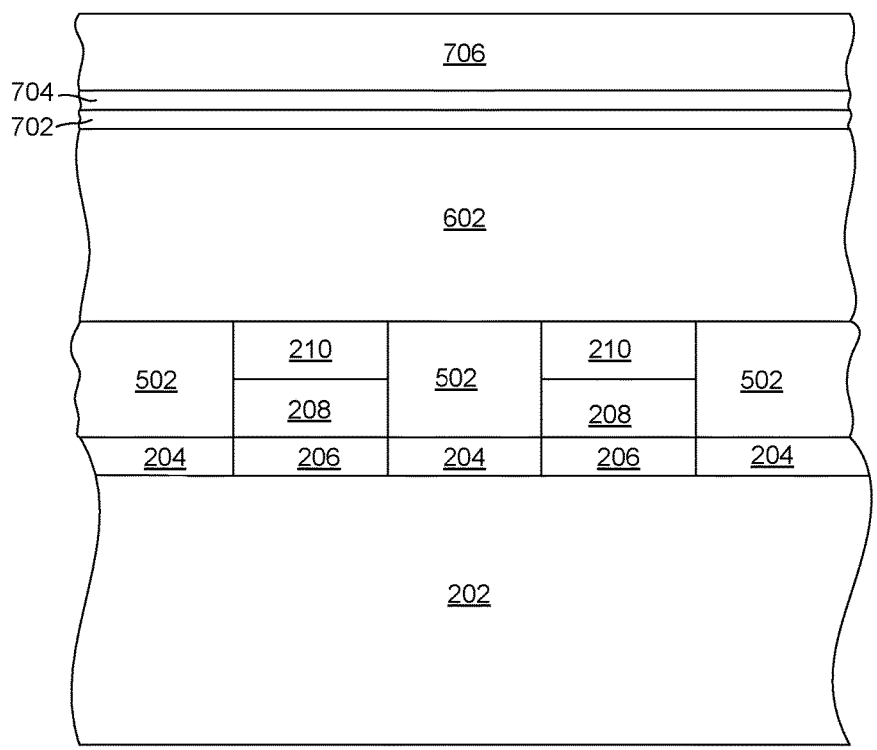

With reference now to FIG. 7, one or more mask layers are deposited over the memory element material layer 602. The mask layers can include: a hard mask layer 702 formed over the memory element material; an anti-reflective coating 704 such as a bottom anti-reflective coating (BARC) deposited over the hard mask material 702; and a photoresist layer 706, deposited over the anti-reflective coating 704 and hard mask 702. The photoresist layer 706 can be a spin-on glass photoresist.

Figure 8:
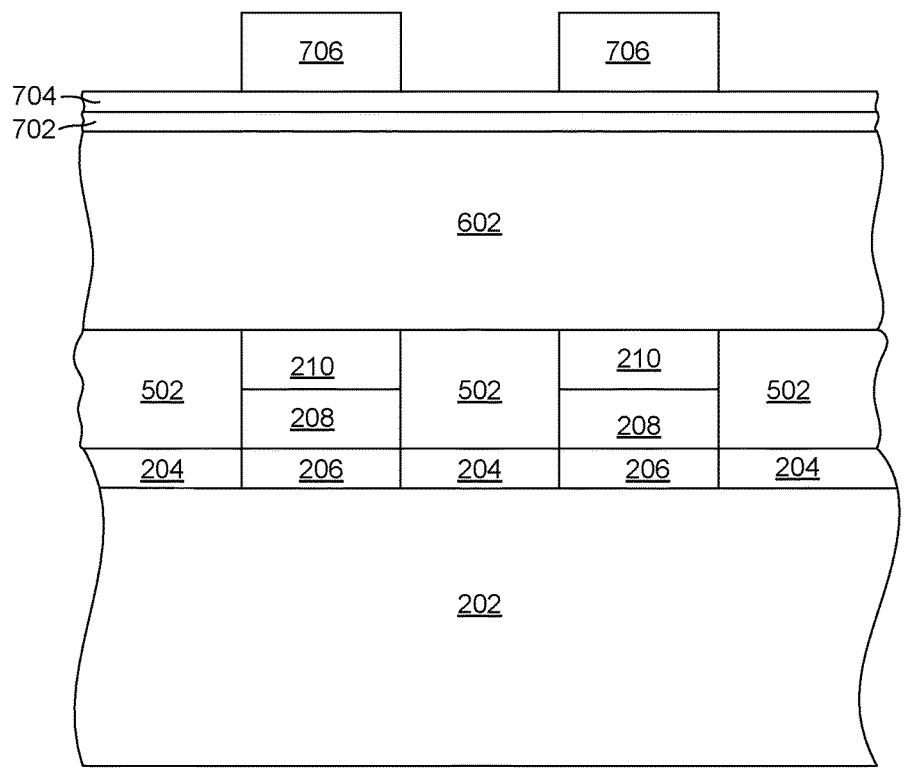
Figure 9:
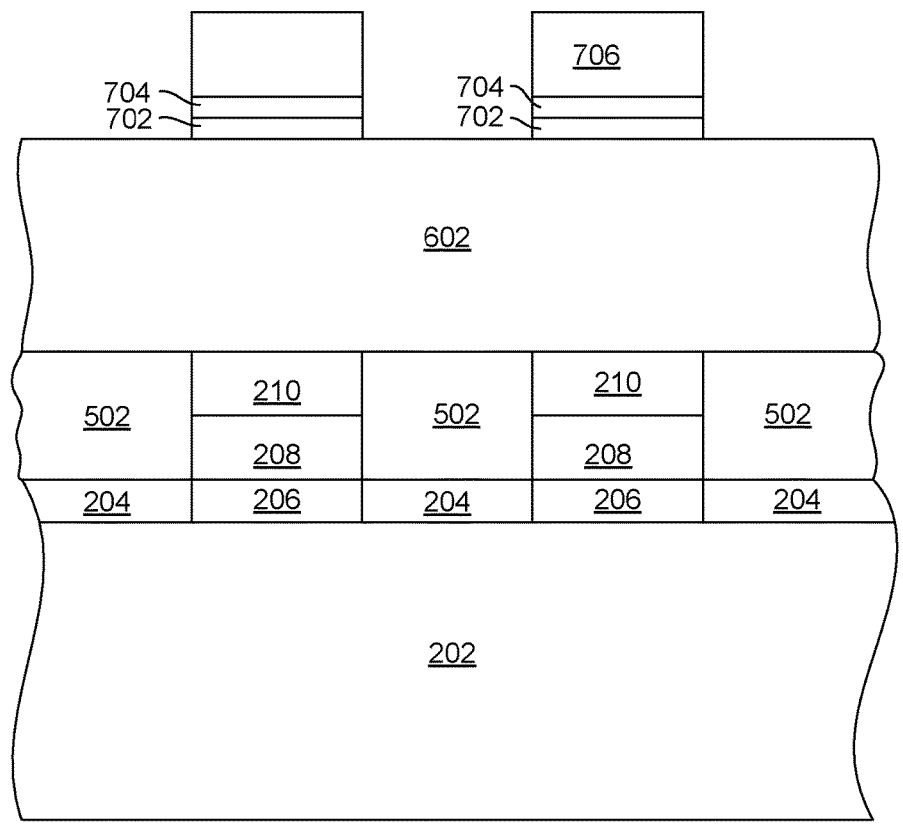

The photoresist layer 706 can then be photolithographically patterned to form a photoresist mask 706 as shown in FIG. 8, with the mask 706 covering areas where the memory element pillars will be formed (e.g. over the electrodes 206). With the photoresist 706 patterned as described, an etching process such as reactive ion etching (RIE) can be performed to transfer the image of the photoresist mask 706 onto the underlying anti-reflective coating 704 and hard mask 702, leaving a structure as shown in FIG. 9, with a hard mask 702 covering areas where the magnetic element pillars will be formed.

Figure 10:
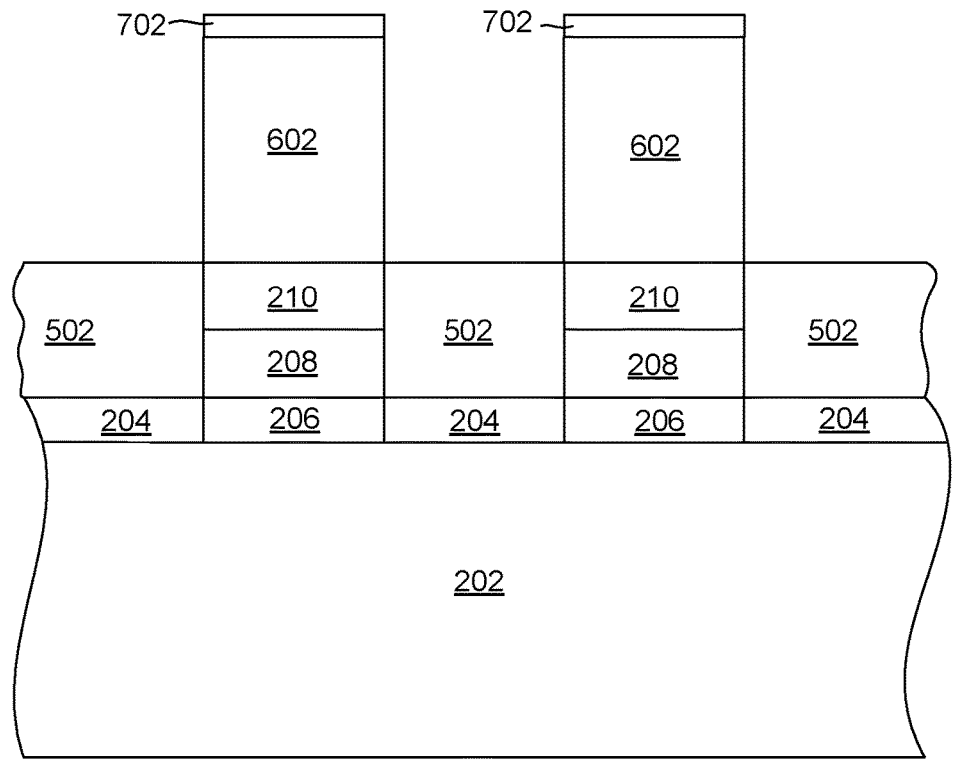

Then, with reference to FIG. 10, a material removal process is performed to remove portions of the memory element material 602 that are not protected by the hard mask 702 to define magnetic memory element pillars 602. The material removal process used to form the magnetic memory element pillars is preferably ion milling. The ion milling process can consume some or all of the photoresist 706 and anti-reflective coating 704. However, the hard mask 702 may remain mostly intact through the ion milling process.

As discussed above, this ion milling process is preferably performed at one or more angles relative to normal in order to form optimally defined side walls for the magnetic pillars 602. Ion milling near normal angles remove most of the exposed material but it also redeposits some material on the sidewall of the pillars. The non-normal ion milling is then utilized to remove the re-deposited material at the sides of the pillars. Also as discussed above, the height of the magnetic memory pillars 602 affects the amount of shadowing between memory element pillars during the ion milling process. Shadowing effect result in less than optimal ion milling and results in less than optimal side wall formation for the memory element pillars. Therefore, it is advantageous to reduce the height of the memory element pillars 602 that are subjected to the ion milling.

Because the seed layer 208 and under-layer 210 were previously formed and are now embedded in the surrounding insulation layer 502, these layers do not contribute to the height of the remaining element 602 for purposes of the ion milling process, and therefore do not contributing to the shadowing effect. Since the seed layer 208 and under-layer 210 are a significant fraction of the overall height of the memory element (208, 210, 602) eliminating these layers from the height of the structure to be ion milled greatly reduces the shadowing effect, leading to much better magnetic memory element pillar definition. In addition, because the thickness of the layers 208, 210 do not contribute to the pillar height during ion milling, there is no constraint on their thickness. This means that the layers 208, 210 can be constructed to their optimal operational thickness without the need to strike a balance between maintaining optimal seed layer and under-layer thicknesses 208, 210 and minimizing shadowing.

Figure 11:
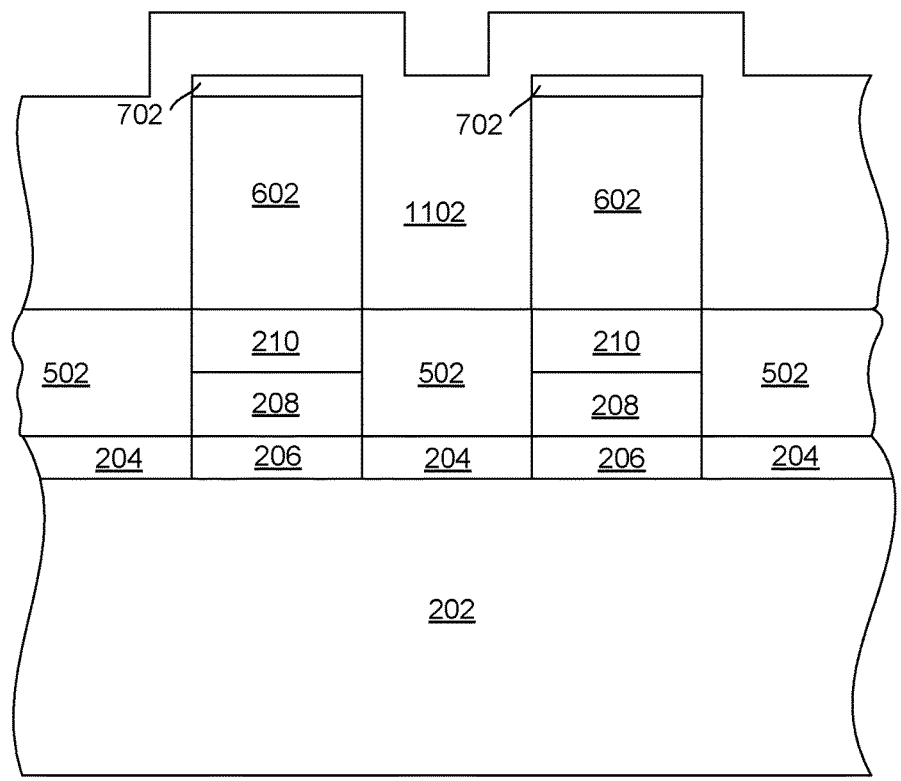

With the memory element pillars formed by the ion milling process as described above with reference to FIG. 10, an electrically insulating fill layer 1102 can be deposited as shown in FIG. 11. The electrically insulating fill layer 1102 can be an oxide material such as alumina ($Al_2O_3$) or silicon oxide (e.g. silicon dioxide ($SiO_2$)) and is preferably deposited to a thickness that reaches at least the top of the formed memory element pillars 602. Then, a chemical mechanical polishing process (CMP) can be performed sufficiently to expose the tops of the memory element pillars 602. Further processing can then be performed to provide electrical connection between the top portion of the memory element pillars 602 and relevant processing circuitry (not shown).

Figure 12:
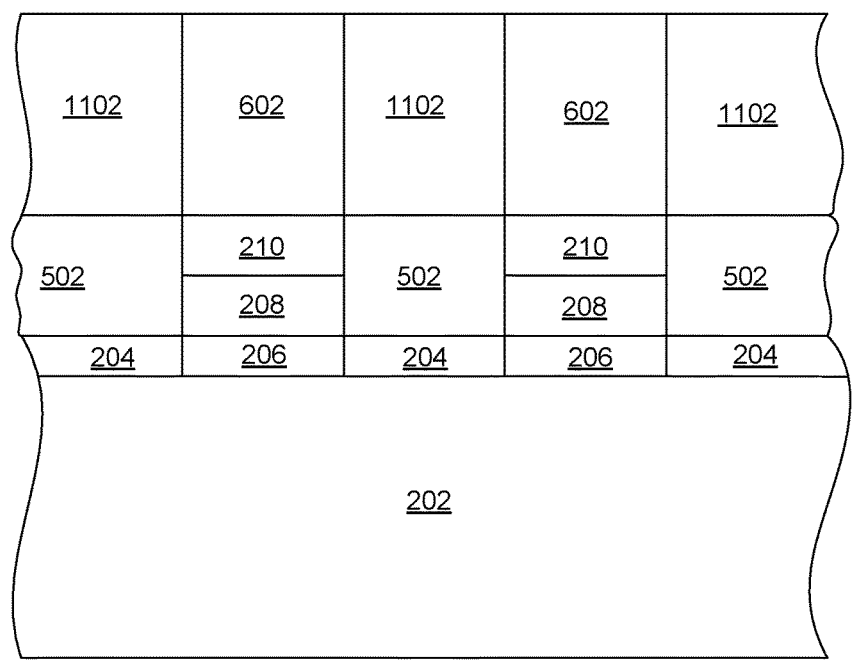

As can be seen, the resulting structure as shown in FIG. 12, includes the seed layer 208 and under-layer 210 formed over the seed layer 208, the under-layer having an upper surface. A first insulation layer 502 laterally surrounds the seed layer 208 and under-layer 210, the first electrically insulating layer having an upper surface that is co-planar with the upper surface of the under-layer 210. A magnetic memory element pillar 602 is formed on the under-layer. The magnetic memory element pillar is laterally surrounded by a second layer of electrically insulating material 1102 that is formed upon the first layer of electrically insulating material 502.

Figure 13:
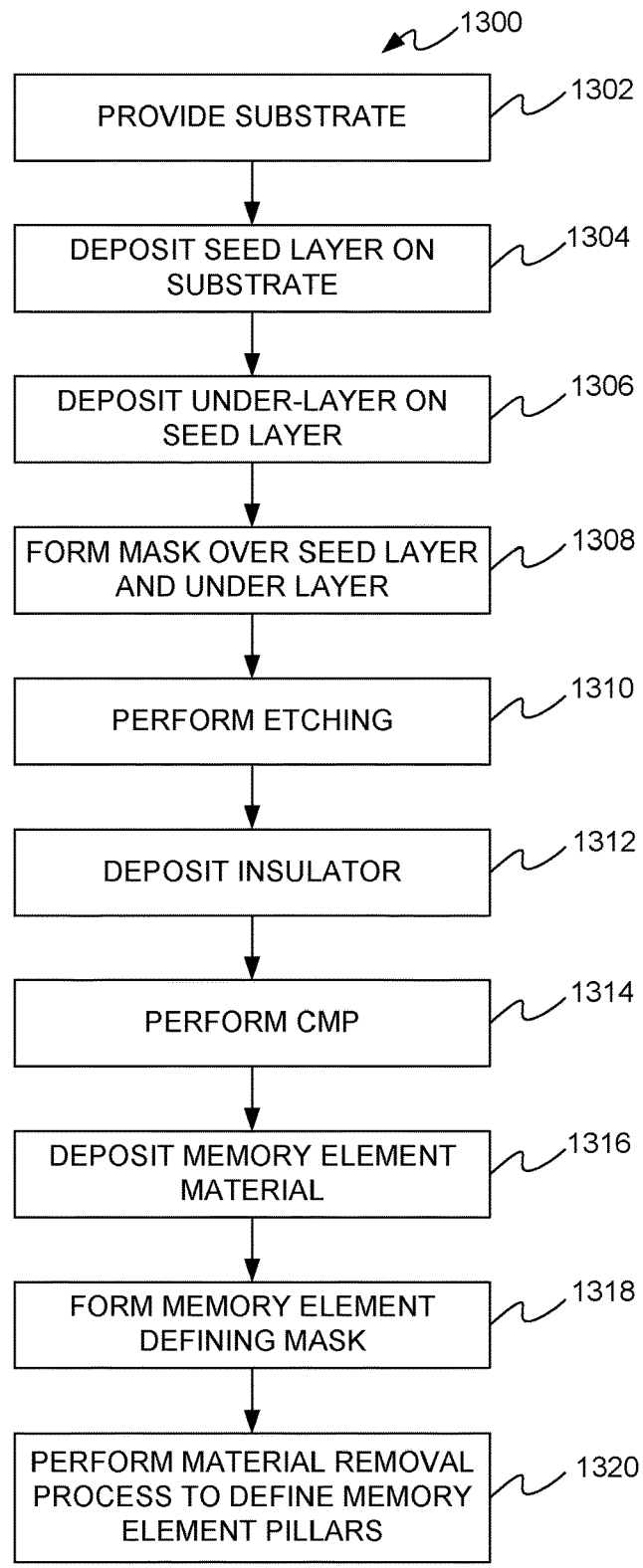
FIG. 13 is a flowchart of a method, in accordance with one embodiment.

Now referring to FIG. 13, a method 1300 is shown according to one embodiment. The method 1300 may be performed in accordance with the present invention in any of the environments depicted in FIGS. 2-12, among others not specifically described, in various approaches. Of course, more or less operations than those specifically described in FIG. 13 may be included in method 1300, as would be understood by one of skill in the art upon reading the present descriptions.

Each of the operations of method 1300 may be performed by any suitable component of the operating environment. For example, in various embodiments, the method 1300 may be partially or entirely performed by a machine, controller, processing circuit, or some other device or combination of devices suitable for manufacturing and/or processing a thin film structure. A processing circuit may include one or more processors, chips, and/or modules implemented in hardware and/or software, and preferably having at least one hardware component, and may be utilized in any device to perform one or more operations of the method 1300. Illustrative processing circuits include, but are not limited to, a central processing circuit (CPU), an application specific integrated circuit (ASIC), a field programmable gate array (FPGA), etc., combinations thereof, or any other suitable computing device known in the art.

With reference to FIG. 13, in a step 1302, a substrate is provided. As discussed above, this may be a substrate having circuitry such as CMOS circuitry embedded therein and has a surface having electrodes formed therein. The electrodes can be separated by electrically insulating material.

Then, in a step 1304 a seed layer material is deposited over the substrate. The seed layer may be a material such as tantalum, and can be deposited by sputter deposition. In a step 1306, an memory element under-layer material is deposited over the seed layer. The under-layer can be a material such as ruthenium.

Then, in a step 1308, a mask is formed over the under-layer and seed layer. The mask can be configured to leave areas over the electrodes covered while leaving adjacent areas over the electrically insulating layers uncovered. In a step 1310 an etching process such as reactive ion etching is performed to remove seed layer and under-layer material not protected by the mask, leaving portions of the seed layer and under-layer remaining over the electrodes.

Then, in a step 1312 an electrically insulating material is deposited. The electrically insulating material can be $SiO_2$ and can be deposited by sputter deposition. In a step 1314, a chemical mechanical polishing (CMP) process is performed to planarize the deposited electrically insulating layer and expose the top of the remaining under-layer. A light re-deposition of under-layer material may optionally be performed after the CMP.

Then, in a step 1316 a memory element material is deposited. The memory element material can include a magnetic reference layer, a non-magnetic barrier layer such as MgO, a magnetic free layer, as well as other layers. Then, in a step 1318 a memory element mask is formed. The memory element mask can include a hard mask material constructed of a material that is resistant to ion milling, such as tantalum or diamond like carbon. The memory element mask can be formed by photolithographically patterning a layer of photoresist and performing a reactive ion etching to transfer the image of the patterned photoresist onto the under-lying hard mask material.

Then, in a step 1320, a material removal process is performed to remove portions of the magnetic element material that are not protected by the previously formed memory element defining mask to form memory element pillars. The material removal process is preferably an ion milling process that is preferably performed at one or more non-zero angles relative to normal in order to form magnetic memory element pillars with optimally defined side walls.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A method for manufacturing a magnetic memory device, the method comprising:
   depositing a seed layer;
   depositing an under-layer over the seed layer;
   forming a mask structure over the under-layer, the mask structure being configured to cover a magnetic device area;
   performing an etching process to remove portions of the under-layer and seed layer that are not protected by the mask;
   depositing an electrically insulating layer;
   performing a chemical mechanical polishing (CMP) sufficiently to expose the under-layer;
   after performing the CMP, depositing a thin layer of under-layer material by sputter deposition to a thickness no greater than 3 Angstroms; and
   forming a magnetic memory element pillar over the under-layer.

2. The method as in claim 1, wherein the forming a magnetic memory element pillar further comprises:
   depositing a magnetic memory element material;
   forming a magnetic memory element defining mask over the magnetic memory element material; and
   performing an ion milling.

3. The method as in claim 2, wherein the ion milling is performed at an angle relative to normal.

4. The method as in claim 1, wherein the electrically insulating layer comprises silicon oxide.

5. The method as in claim 1, further comprising after performing the CMP, depositing a thin layer of under-layer material over the under-layer.

6. The method as in claim 1, wherein the seed layer comprises tantalum.

7. The method as in claim 1, wherein the chemical mechanical polishing is performed sufficiently to form coplanar upper surfaces for the under-layer and the electrically insulating layer.

8. The method as in claim 1, wherein the seed layer is deposited on a substrate that includes electrically conductive electrodes separated by dielectric layers and wherein the mask is formed to cover areas over the electrically conductive electrodes and leave areas over the dielectric layers uncovered.

9. The method as in claim 1, wherein the electrically insulating layer comprises silicon oxide deposited by sputter deposition.

10. The method as in claim 1, wherein the electrically insulating layer is deposited to a thickness that extends to a top surface of the under-layer.

11. The method as in claim 1, wherein the under-layer comprises ruthenium and has a thickness of 30 angstroms.

12. The method as in claim 1, wherein the seed layer comprises tantalum and has a thickness of 10 angstroms.

13. The method as in claim 1, wherein the magnetic memory element pillar comprises a magnetic reference layer, a non-magnetic barrier layer and a magnetic free layer.

* * * * *